United States Patent
Duan et al.

(10) Patent No.: US 8,007,060 B2
(45) Date of Patent: Aug. 30, 2011

(54) SLIDE ASSEMBLY WITH LOCKING DEVICE

(75) Inventors: Zhi-Ming Duan, Shenzhen (CN); Jun Liu, Shenzhen (CN); Xiu-Fang Hou, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 402 days.

(21) Appl. No.: 12/333,651

(22) Filed: Dec. 12, 2008

(65) Prior Publication Data

US 2010/0019638 A1 Jan. 28, 2010

(30) Foreign Application Priority Data

Jul. 25, 2008 (CN) ...................... 2008 2 0301600 U

(51) Int. Cl.
*A47B 88/00* (2006.01)
(52) U.S. Cl. .................. 312/334.44; 312/333
(58) Field of Classification Search ........... 312/334.44–334.47, 333, 330.1, 312/319.1, 334.1, 334.7, 334.8; 384/21
See application file for complete search history.

(56) References Cited

U.S. PATENT DOCUMENTS

| | | | | |
|---|---|---|---|---|
| 6,367,899 B1 * | 4/2002 | Hwang et al. | ............ | 312/334.47 |
| 6,945,619 B1 * | 9/2005 | Chen et al. | ................ | 312/334.47 |
| 7,029,080 B2 * | 4/2006 | Barry et al. | ..................... | 312/333 |
| 7,101,081 B2 * | 9/2006 | Chen et al. | ........................ | 384/21 |
| 7,654,624 B2 * | 2/2010 | Huang et al. | .................. | 312/333 |
| 7,708,359 B2 * | 5/2010 | Peng et al. | ................ | 312/334.47 |
| 7,726,755 B2 * | 6/2010 | Peng et al. | ................ | 312/334.46 |
| 7,740,328 B2 * | 6/2010 | Huang et al. | .................. | 312/333 |
| 2008/0079342 A1 * | 4/2008 | Peng et al. | ..................... | 312/333 |
| 2008/0111457 A1 * | 5/2008 | Ji et al. | ...................... | 312/334.44 |
| 2008/0211366 A1 * | 9/2008 | Brock et al. | .................. | 312/333 |
| 2008/0303398 A1 * | 12/2008 | Hsiung et al. | ............ | 312/334.46 |
| 2009/0096340 A1 * | 4/2009 | Chen et al. | ................ | 312/334.46 |

* cited by examiner

*Primary Examiner* — Janet M Wilkens
(74) *Attorney, Agent, or Firm* — Clifford O. Chi

(57) ABSTRACT

A slide assembly includes an outer slide, a blocking member mounted on the outer slide, an inner slide slidably attached to the outer slide, a sliding block slidably mounted on the inner slide, and a long bar slidably attached to an inner side of the inner slide. A groove is defined in the blocking member. The sliding block is inserted in the groove to fix the inner slide on the outer slide. A slanted protrusion extends from the long bar. When the long bar is pulled towards a first direction, the slanted protrusion pushes the sliding block. The sliding block moves towards a second direction substantially perpendicular to the first direction to disengage the inner slide from the outer slide.

20 Claims, 8 Drawing Sheets

SLIDE ASSEMBLY WITH LOCKING DEVICE

BACKGROUND

1. Technical Field

The present disclosure relates to a slide assembly and, particularly, to a slide assembly with a locking device.

2. Description of Related Art

A typical three-section slide for a server unit includes an inner slide, an outer slide, and a third slide. A slide-aiding ball member is sandwiched between any two of the inner slide, the outer slide, and the third slide to enable a smooth sliding movement. The inner slide and the outer slide have a retaining member and a stop member mounted thereon respectively, for restricting movement. The retaining member is attached to an inner surface of the inner slide, and is provided with an engaging portion. The stop member is mounted to a front end of the outer slide, and is provided with a protrusion. When users draw out the inner slide from the outer slide, the protrusion of the stop member engages with the engaging portion of the retaining member to prevent accidental disassembly.

Although the engagement of the stop member with the engaging portion can avoid accidentally releasing the inner slide from the outer slide, the portion of the engagement is positioned at a distal end of the outer slide, and a user's hand may be caught and injured by the inner slide and the outer slide when the user directly disengages the engaging portion from the stop member to let the inner slide retract into the outer slide. Therefore, it is inconvenient and dangerous for users to operate the slide.

What is needed, therefore, is a locking device for a slide assembly which is easily and safely operated.

DETAILED DESCRIPTION

Figure 1:
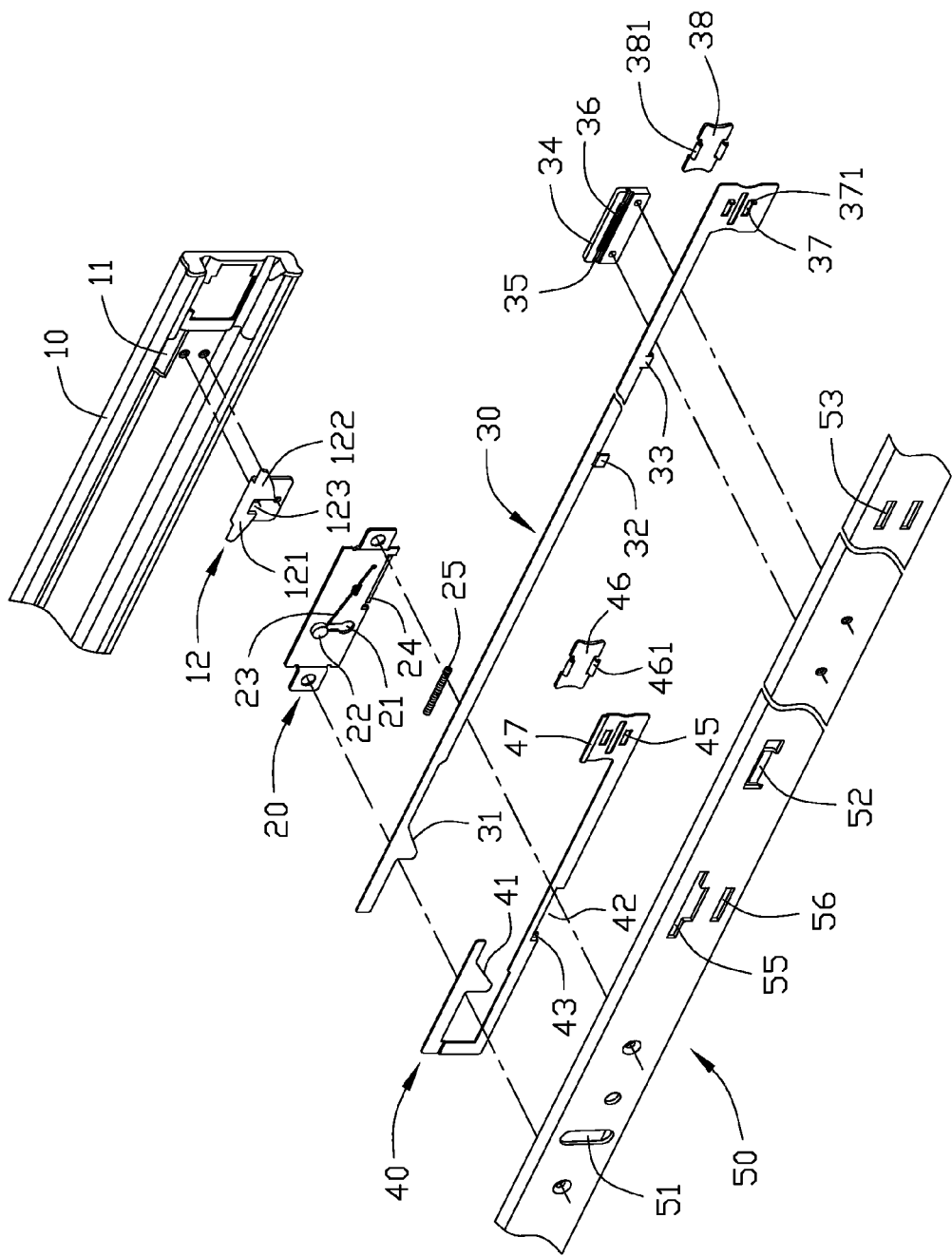
FIG. 1 is an exploded, isometric view of an embodiment of a slide assembly, the slide assembly including a fixing member, an outer slide, and an inner slide.
Figure 2:
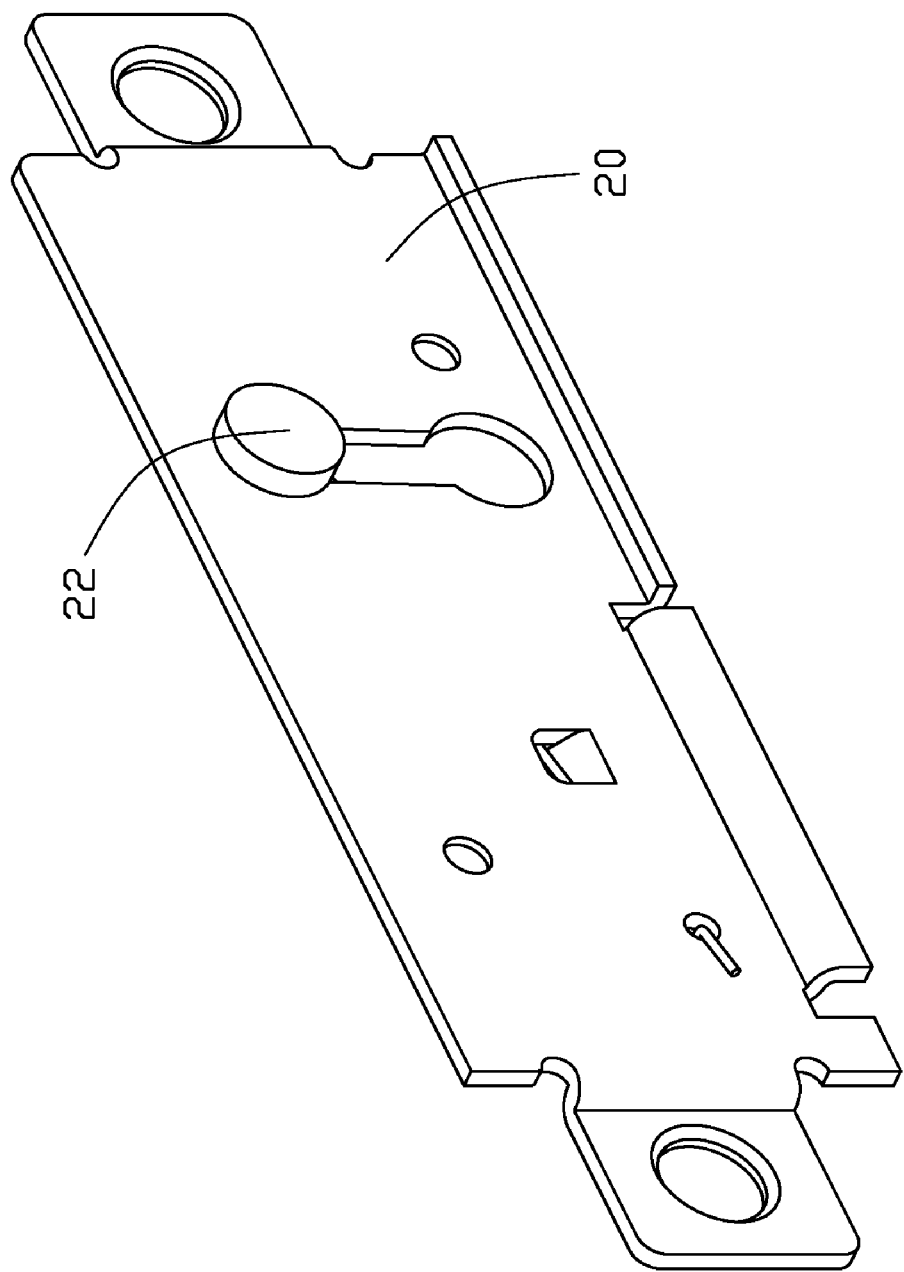
FIG. 2 is an isometric view of the fixing member of the slide assembly of FIG. 1.

Referring to FIG. 1 and FIG. 2, a slide assembly includes an inner slide 10 and an outer slide 50. A cutout 11 is defined in an end of the outer slide 50. A blocking member 12 is mounted to the outer slide 50 through the cutout 11. The blocking member 12 includes a low arched portion 121, a high arched portion 122, and a groove 123 therebetween.

The inner slide 10 includes a fixing member 20, a long bar 30, and a short bar 40. A slot 21 is defined in the fixing member 20. A sliding block 22 is slidable in the slot 21. A hole 51 is defined in the outer slide 50 corresponding to the slot 21 and the sliding block 22. A spring 23 is formed on the sliding block 22 and the fixing member 20 so that the sliding block 22 is resiliently fixed on the fixing member 20. A recess 24 is defined in a bottom portion of the fixing member 20. A compression spring 25 is arranged in the recess 24.

A slanted protrusion 31 is formed on an end of the long bar 30. A first hook 32 is formed on a middle portion of the long bar 30 towards the outer slide 50. A flange 52 is formed on the outer slide 50 corresponding to the first hook 32. The flange 52 is bent towards the first hook 32. A second hook 33 is formed adjacent to the first hook 32 towards the inner slide 10. A plastic pressing member 34 is mounted on the inner slide 10 corresponding to the second hook 33. An inserting slot 35 is defined in the pressing member 34. A compression spring 36 is arranged in the inserting slot 35 adjacent to the second hook 33. A pair of substantially parallel cutouts 37 is defined in another end of the long bar 30. A flange 371 is formed on an end of each cutout 37. A pair of substantially parallel holes 53 is defined in the inner slide 50 corresponding to the cutouts 37. A first handle 38 includes a pair of hooks 381 corresponding to the cutouts 37, and capable of engaging with the long bar 30.

A slanted protrusion 41 is formed on an end of the short bar 40. A cutout 42 is defined in the short bar 40 corresponding to the compression spring 25 of the fixing member 20. A bent block 43 is formed adjacent to the cutout 42. A pair of substantially parallel cutouts 45 is defined in another end of the short bar 40. A second handle 46 includes a pair of hooks 461 corresponding to the cutouts 45, and capable of engaging with the short bar 40. A blocking rim 47 is bent from a top portion of the short bar 40 adjacent to the cutouts 45 towards the inner slide 10. A T-shaped hole 55 and a substantially rectangular hole 56 are defined in the inner slide 50 corresponding to the cutouts 45 and the blocking rim 47.

Figure 3:
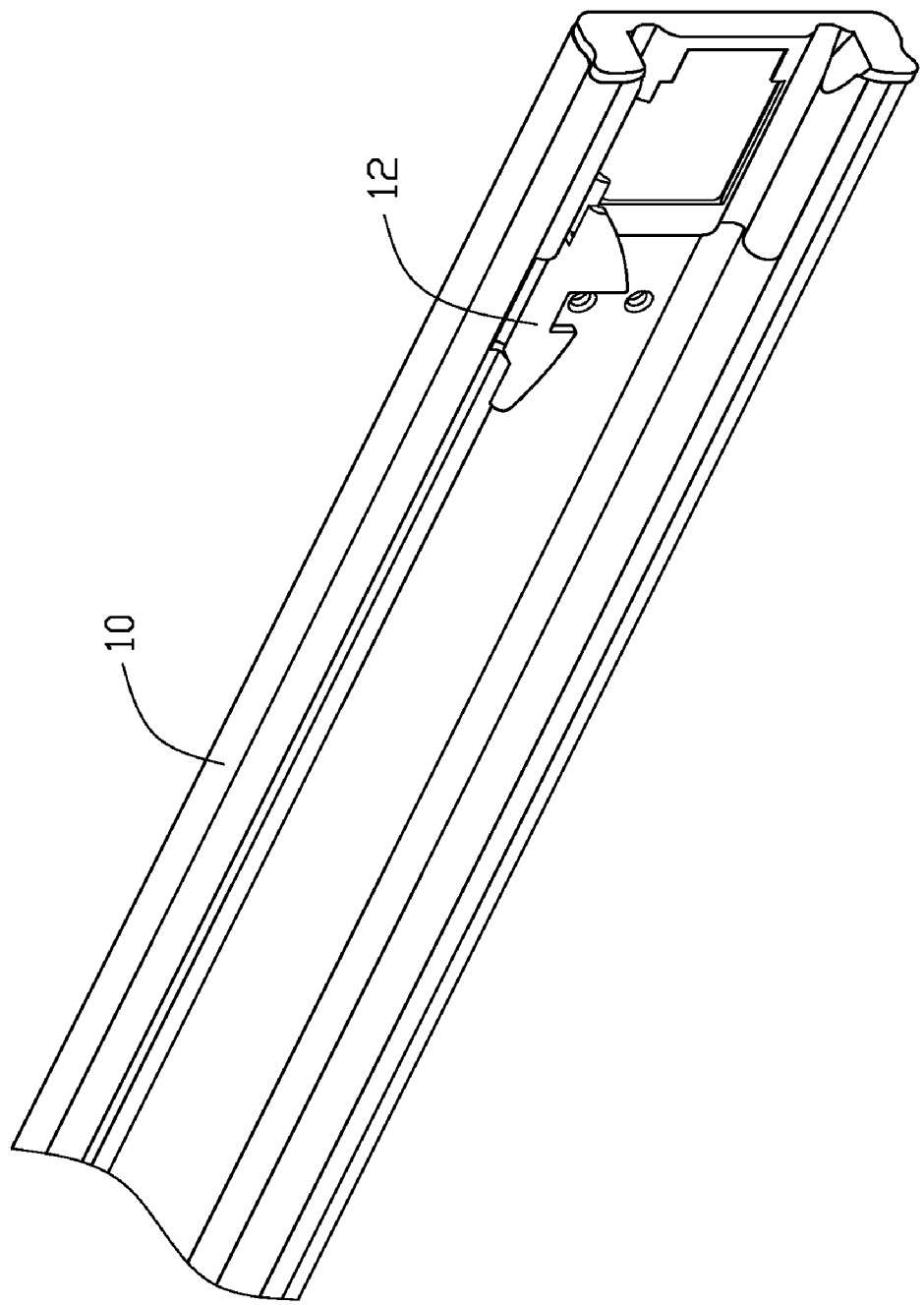
FIG. 3 is a partially assembled view of the outer slide of the slide assembly of FIG. 1.
Figure 4:
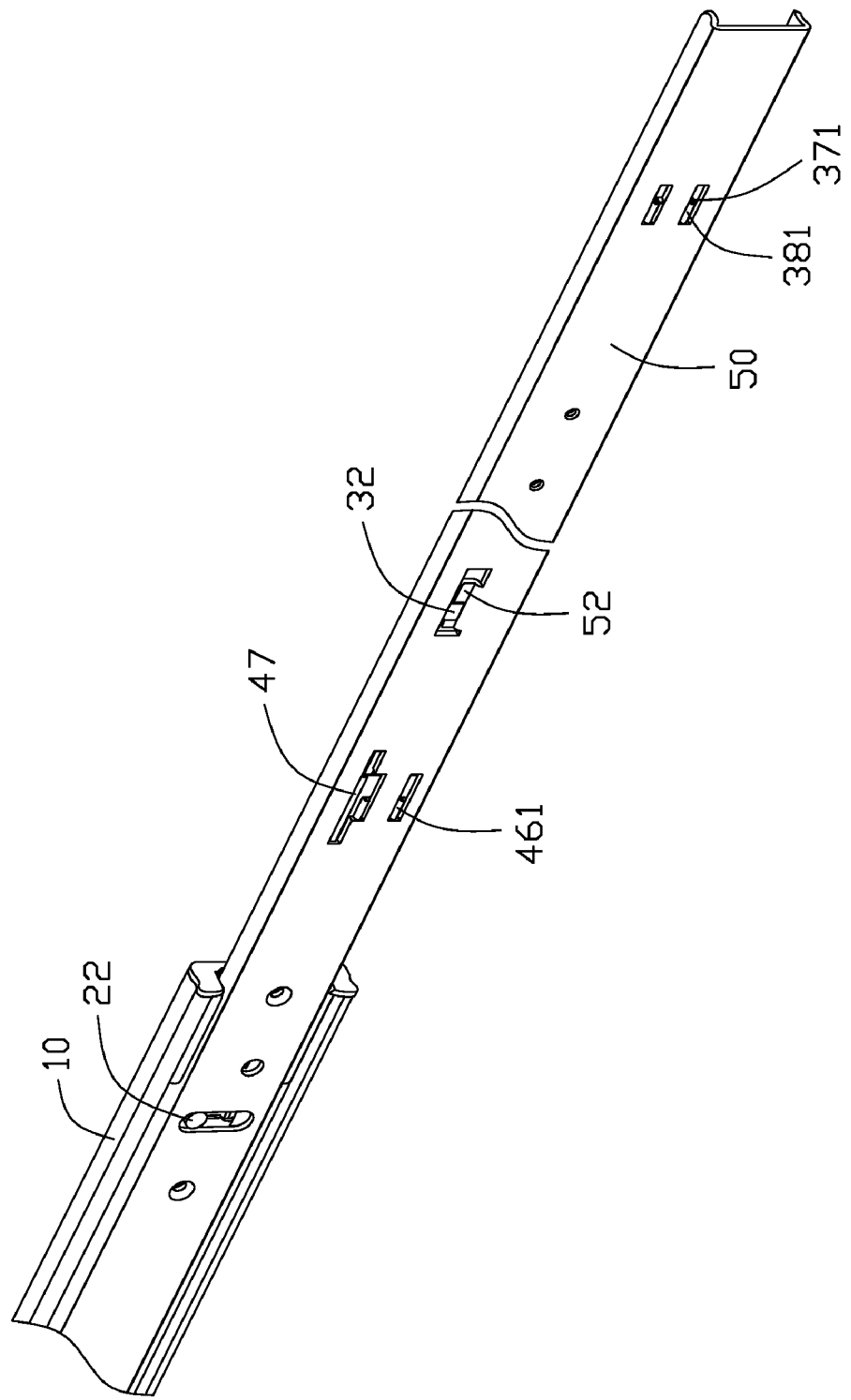
FIG. 4 is an assembled view of FIG. 1.
Figure 5:
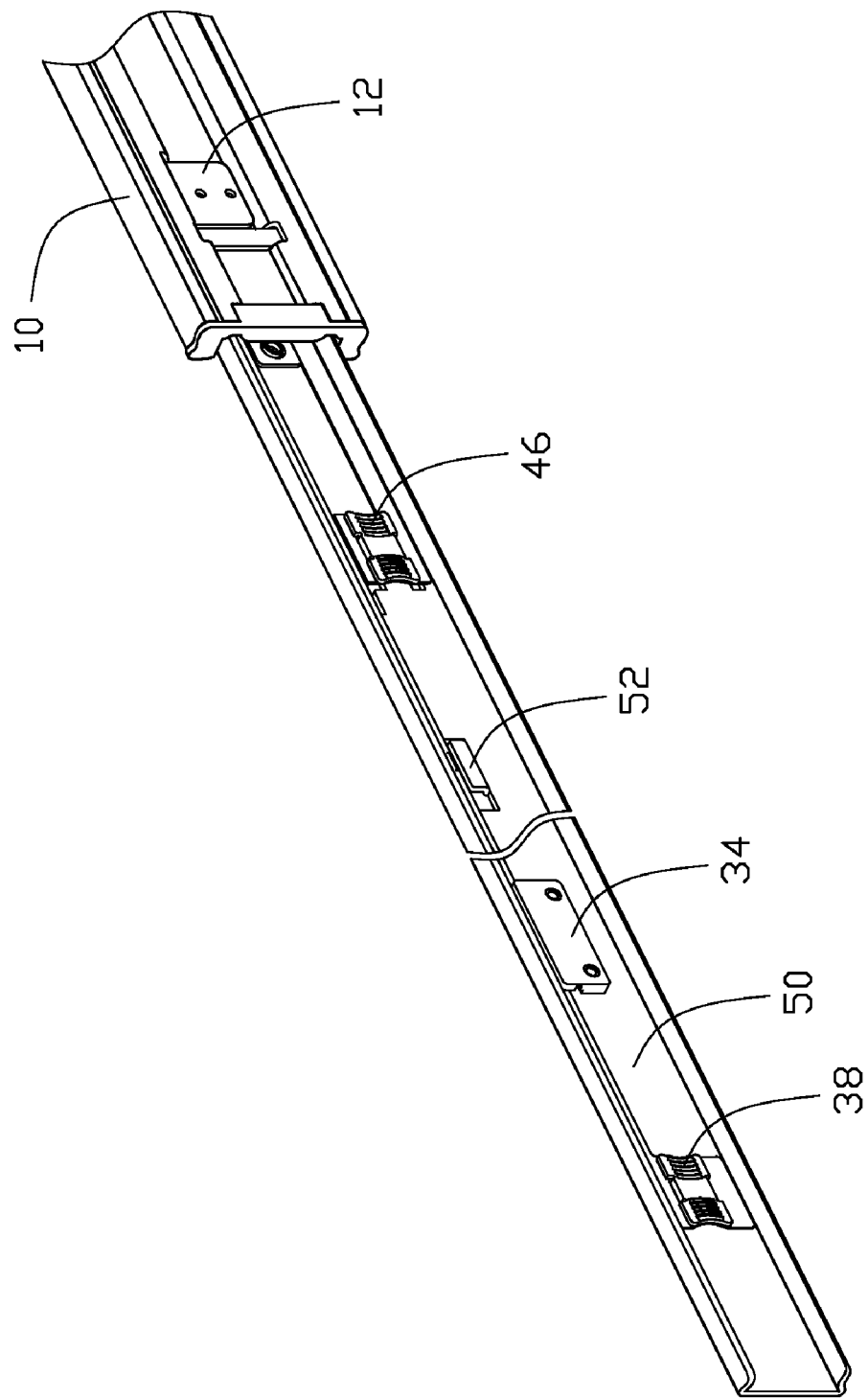
FIG. 5 is similar to FIG. 4, but viewed from another aspect.

Referring also to FIGS. 3 through 5, the blocking member 12 is mounted on the outer slide 10 through the cutout 11. The fixing member 20 is fixed on the inner slide 50. The compression spring 25 is sandwiched between the fixing member 20 and the inner slide 50. The sliding block 22 is exposed via the hole 51 of the inner slide 50. The hooks 461 extend into the corresponding cutouts 45. The hooks 461 and the blocking rim 47 are exposed via the T-shaped hole 55 and the substantially rectangular hole 56. The first hook 32 engages with the flange 52. The pressing member 34 is mounted on the inner slide 50. The long bar 30 is sandwiched between the pressing member 34 and the inner slide 50. The second hook 33 abuts against the compression spring 36. The hooks 381 extend into the cutouts 37, and are exposed via the hole 53. A small space exists between the flange 371 and an end of the hole 53 to limit movement of the inner slide 50.

Figure 6:
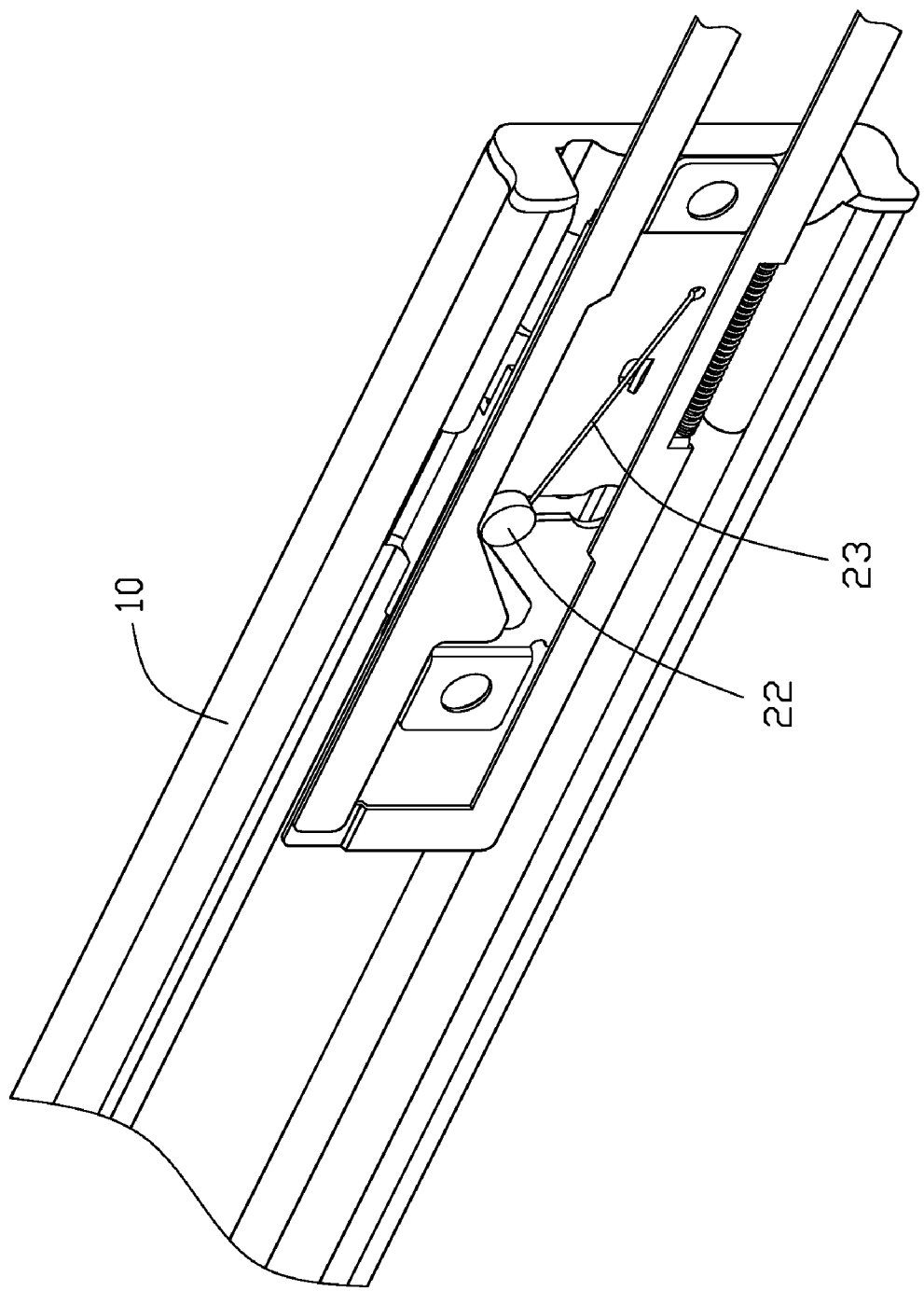
FIG. 6 is similar to FIG. 4, but viewed without an inner slide.
Figure 7:
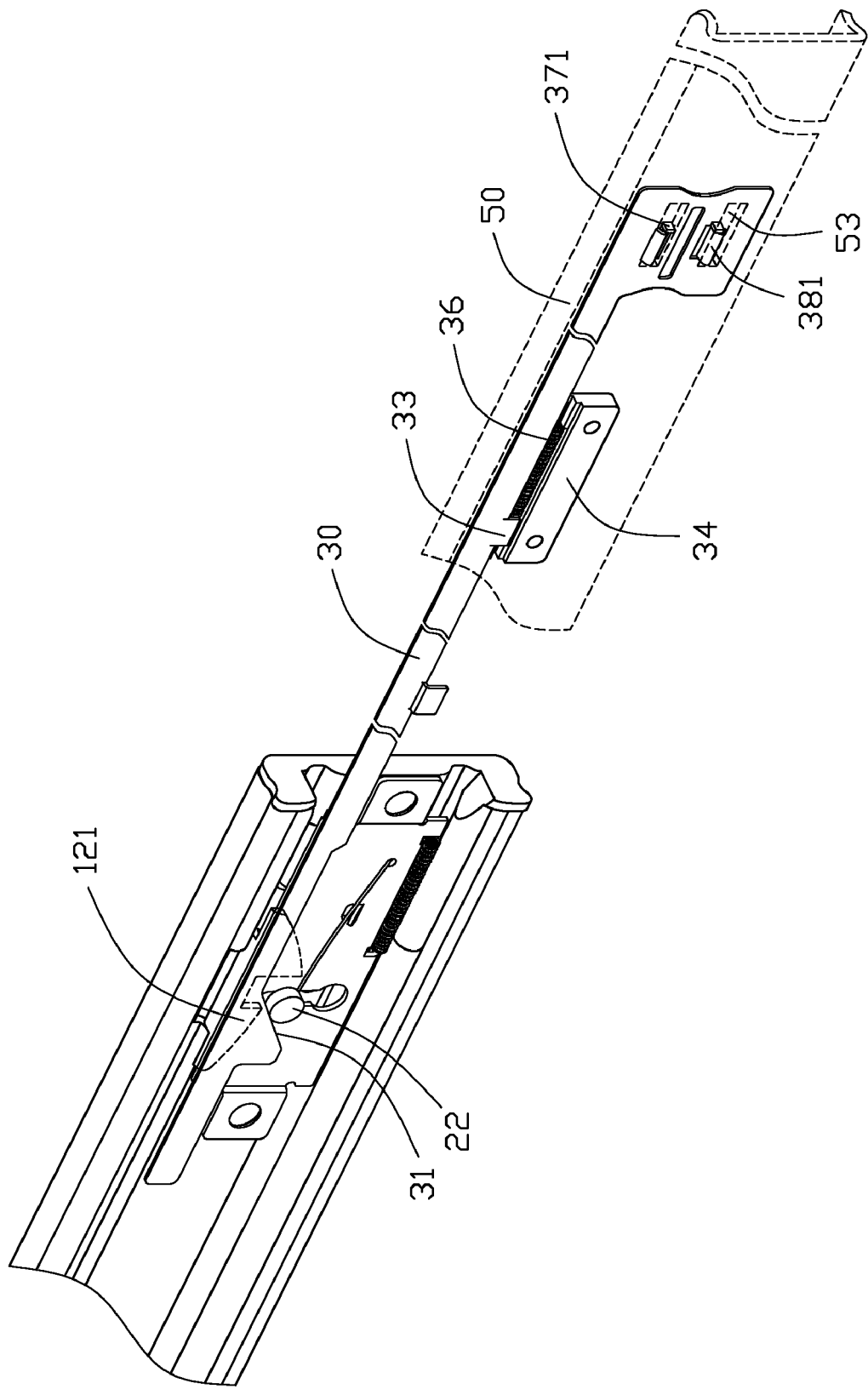
FIG. 7 is similar to FIG. 4, but viewed when the inner slide is retracted.

Referring also to FIG. 6 and FIG. 7, when the inner slide 50 is drawn out along a first direction away from the outer slide 10, the sliding block 22 slides over the low arched portion 121. The sliding block 22 is urged into the groove 123 by a resilient force of the spring 23 to block the inner slide 50. When the inner slide 50 is retracted along a third direction opposite to the first direction, the first handle 38 is pulled away from the outer slide 10. The hook 381 pushes the flange 371. The second hook 33 pushes the compression spring 36. The slanted protrusion 31 presses the sliding block 22. The sliding block 22 slides in the slot 21 along the second direction substantially perpendicular to the first direction. The sliding block 22 slides over the low arched portion 121. The inner slide 50 is pushed towards the outer slide 10 to retract the inner slide 50. The second hook 33 is resetted by the compression spring 36. The sliding block 22 is resetted by the spring 23. The length of the holes 53 limits the sliding range of the hooks 381. Thus, the long bar 30 is prevented from traveling too far so that the sliding block 22 does not slide over the high arched portion 122, which would cause the inner slide 50 to disengage from the outer slide 10.

Figure 8:
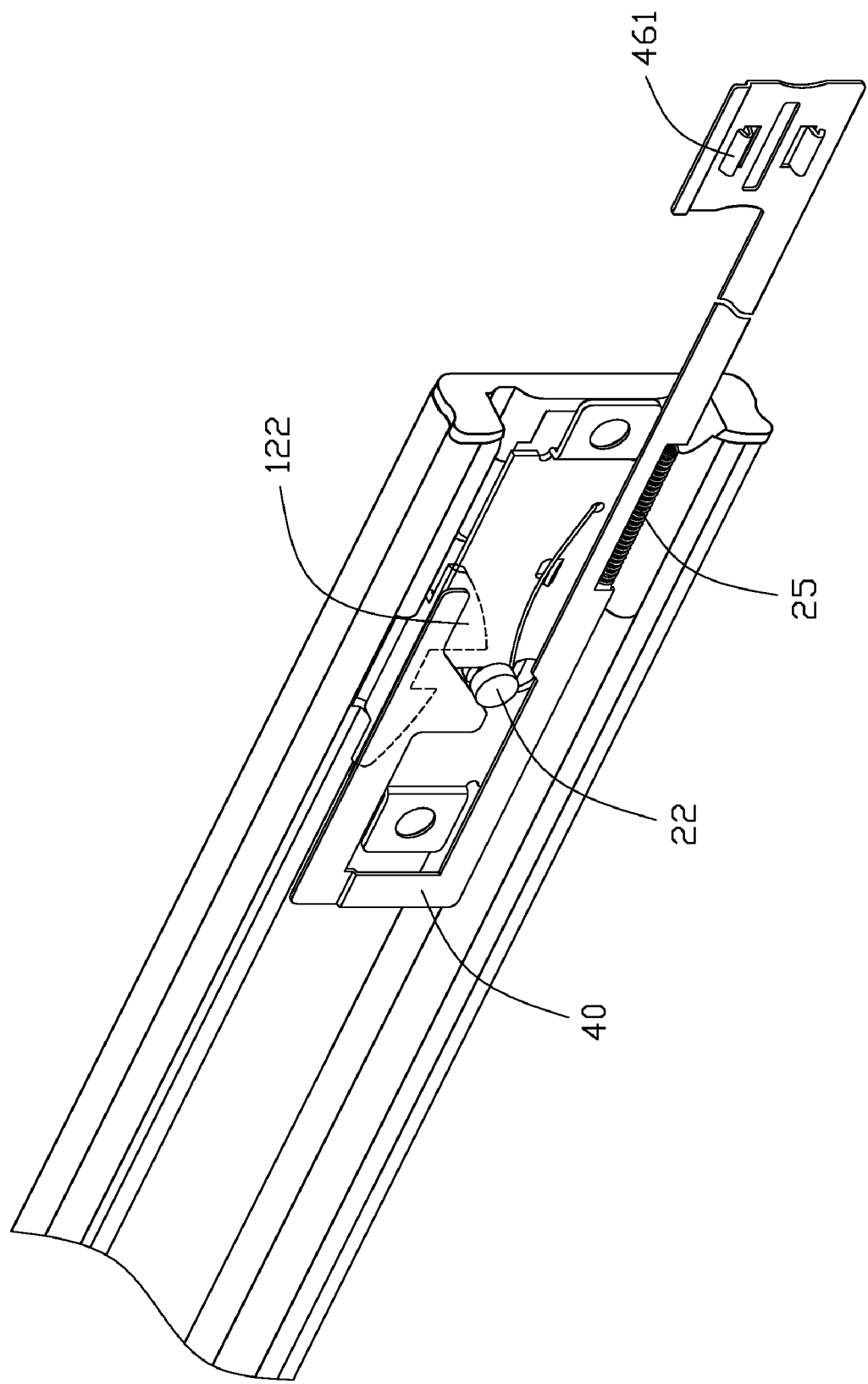
FIG. 8 is similar to FIG. 4, but viewed when the inner slide is extended.

Referring to FIG. 8, when the inner slide 50 is extended from the outer slide 10, the second handle 46 is pulled towards the first direction. The hooks 461 drive the short bar 40 to move. The hooks 461 and the blocking rim 47 move in the T-shaped hole 55 and the rectangular hole 56 towards the first direction. The bent block 43 pushes the compression spring 25. The slanted protrusion 41 presses the sliding block 22 so that the sliding block 22 slides over the high arched portion 122. The inner slide 50 is extended. The short bar 40 is resetted by the compression spring 25. The sliding block 22 is resetted by the spring 23.

It is to be understood, however, that even though numerous characteristics and advantages of the present disclosure have been set forth in the foregoing description, together with details of the structure and function of the embodiments, the disclosure is illustrative only, and changes may be made in detail, especially in matters of shape, size, and arrangement of parts within the principles of the present disclosure to the full extent indicated by the broad general meaning of the terms in which the appended claims are expressed.

What is claimed is:

1. A slide assembly, comprising:
an outer slide;
a blocking member mounted on the outer slide, wherein a groove is defined in the blocking member;
an inner slide slidably attached to the outer slide;
a sliding block slidably mounted on the inner slide, wherein the sliding block is engaged in the groove to fix the inner slide on the outer slide; and
a long bar slidably attached to an inner side of the inner slide, wherein a slanted protrusion extends from the long bar; when the long bar is pulled towards a first direction, the slanted protrusion pushes the sliding block, and the sliding block moves towards a second direction substantially perpendicular to the first direction to disengage the inner slide from the outer slide.

2. The slide assembly as described in claim 1, wherein the inner slide disengages from the outer slide along a third direction opposite to the first direction.

3. The slide assembly as described in claim 1, wherein the blocking member comprises a low arched portion and a high arched portion; the long bar is pulled so that the slanted protrusion presses the sliding block, the sliding block disengages from the low arched portion.

4. The slide assembly as described in claim 3, further comprising a short bar mounted on the inner side of the inner slide; a slanted protrusion extends from the short bar; when the short bar is pulled towards the first direction, the slanted protrusion pushes the sliding block to move along the second direction, the sliding block disengages the high arched portion, the inner slide is pulled towards the first direction and is capable of disengaging the inner slide from the outer slide.

5. The slide assembly as described in claim 4, wherein a pair of holes is defined in a first end of the short bar; a second handle is capable of pulling the short bar; the second handle comprises a pair of hooks corresponding to the holes.

6. The slide assembly as described in claim 1, further comprising a fixing member mounted on the inner side of the inner slide; a slot is defined in the fixing member to receive the sliding block; the sliding block is exposed on two sides of the fixing member.

7. The slide assembly as described in claim 6, wherein a spring is formed on the fixing member and the sliding block to reset the sliding block.

8. The slide assembly as described in claim 1, wherein a pair of holes is defined in a first end of the long bar; a first handle is capable of pulling the long bar; the first handle comprises a pair of hooks corresponding to the holes.

9. The slide assembly as described in claim 8, wherein a pair of holes is defined in a first end of the inner slide corresponding to the hooks; a flange is formed from an end of each hole of the long bar; a space exists between the flange and an end of the hole of inner slide to limit pulling the long bar.

10. The slide assembly as described in claim 1, wherein a pressing member is formed on the inner slide; a compression spring is embedded in the pressing member; a hook extends from the long bar to push the compression spring.

11. A slide assembly, comprising:
a first slide;
a blocking member extends from the first slide, wherein a groove is defined in the blocking member; and
a second slide slidably attached to the first slide, wherein a sliding block extends from the second slide; the sliding block is engaged in the groove to fix the second slide on the first slide; a short bar is slidably attached to an inner side of the second slide; a slanted protrusion extending from the short bar; when the short bar is pulled towards a first direction at a force lower than a predetermined force, the slanted protrusion urges the sliding block, the sliding block moves towards a second direction substantially perpendicular to the first direction to disengage the second slide from the first slide, and the second slide is retracted in the first slide; when the short bar is pulled at a force greater than the predetermined force, the second slide is extended from the first slide towards the first direction.

12. The slide assembly as described in claim 11, wherein the second slide disengages from the first slide along a third direction opposite to the first direction.

13. The slide assembly as described in claim 11, wherein the blocking member comprises a low arched portion and a high arched portion; when the short bar is pulled at the force lower than the predetermined force, the slanted protrusion presses the sliding block, the sliding block disengages from the low arched portion, and the second slide is retracted in the first slide; when the short bar is pulled at the force greater than the predetermined force, the sliding block disengages from the high arched portion and the second slide is extended from the first slide.

14. The slide assembly as described in claim 13, further comprising a long bar mounted on the inner side of the second slide, a slanted protrusion extends from the long bar; when the long bar is pulled towards the first direction, the slanted protrusion pushes the sliding block to move along the second direction, the sliding block disengages from the high arched portion, the second slide is pulled towards the first direction to disengage the second slide from the first slide, so that the second slide is retracted in the first slide.

15. The slide assembly as described in claim 14, wherein a pair of holes is defined in a first end of the long bar, a first handle is capable of pulling the long bar; the first handle comprises a pair of hooks corresponding to the holes.

16. The slide assembly as described in claim 15, wherein a pair of holes is defined in a first end of the second slide corresponding to the hooks; a flange is formed from an end of each hole of the long bar; a space exists between the flange and an end of the hole of second slide to limit pulling the long bar.

17. The slide assembly as described in claim 11, wherein a pair of holes is defined in a first end of the short bar, a second handle is capable of pulling the short bar; the second handle comprises a pair of hooks corresponding to the holes.

18. The slide assembly as described in claim 11, further comprising a fixing member mounted on the inner side of the second slide; a slot is defined in the fixing member and capable of receiving the sliding block; the sliding block is exposed on two sides of the fixing member.

19. The slide assembly as described in claim 18, wherein a spring is formed on the fixing member and the sliding block to reset the sliding block.

20. The slide assembly as described in claim 11, wherein a pressing member is formed on the second slide; a compression spring is embedded in the pressing member; a hook extends from the long bar to push the compression spring.

* * * * *